(12) United States Patent
Koutsoures

(10) Patent No.: US 6,529,424 B2
(45) Date of Patent: Mar. 4, 2003

(54) PROPAGATION DELAY INDEPENDENT SDRAM DATA CAPTURE DEVICE AND METHOD

(75) Inventor: Dennis Koutsoures, Glendale Heights, IL (US)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 09/858,545

(22) Filed: May 17, 2001

(65) Prior Publication Data

US 2002/0172080 A1 Nov. 21, 2002

(51) Int. Cl.[7] ................................................. G11C 7/00
(52) U.S. Cl. ........................ 365/194; 365/233; 365/193
(58) Field of Search ................................. 365/194, 193, 365/233; 713/401, 503

(56) References Cited

U.S. PATENT DOCUMENTS

| | | |
|---|---|---|
| 5,828,871 A | 10/1998 | Kawaguchi et al. |
| 5,933,623 A | 8/1999 | Takekuma et al. |
| 6,052,329 A | 4/2000 | Iwamoto et al. |
| 6,316,980 B1 * | 11/2001 | Vogt et al. ................ 327/241 |
| 6,401,213 B1 * | 6/2002 | Jeddeloh ................... 713/401 |

* cited by examiner

*Primary Examiner*—A. Zarabian
(74) *Attorney, Agent, or Firm*—Peter Zawilski

(57) ABSTRACT

A method of indicating data availability is disclosed. According to the method a data read operation is commenced for retrieving data signals based on data stored within an SDRAM. The data is provided from the SDRAM device with a first propagation delay. The SDRAM device also provides a strobe signal having a propagation delay similar to the first propagation delay. Based on the strobe signal data is latched out of the SDRAM device, as it is available to be read.

5 Claims, 6 Drawing Sheets

PROPAGATION DELAY INDEPENDENT SDRAM DATA CAPTURE DEVICE AND METHOD

FIELD OF THE INVENTION

The invention relates to electronic memory storage devices and more particularly to electronic memory data access timing to ensure sufficient set up time for output data.

BACKGROUND OF THE INVENTION

Data memory is a common electronic device used for storage and retrieval of data. Typically, data memory stored data in the form of a pair of potential electronic values—on or off; "0" or "1" —which are arbitrarily assigned to one of the available electronic states during design or design in.

The first data memory storage devices were space consuming, power consuming, slow circuits implemented based on the conventional flip flop, each flip flop for storing a single bit. Because the circuits were designed for low speed operation and integrated circuit manufacturing methods were very limited, the gating signals for retrieving data from the memory storage were simple timed signals. For example, with a data latency of 1uS, a circuit designer needed only compute how many clock cycles are necessary to ensure 1uS before strobing read data out of the memory device. This method of latency compensation is both straightforward and easily performed.

Unfortunately, as memory design advances and integrated circuit manufacturing methods improve and diversify, the above noted method becomes more complex. For example, a single memory device manufactured using one or another method may have different data read latencies. Packaging of integrated circuits also may affect data read latencies. Circuit layout and clock frequencies used also affect latencies in some situations. Thus, a present day memory designer determines the maximum data read latency based on a circuit design, layout, manufacturing material, manufacturing process, tolerances in manufacturing, temperature ranges of operation, and so forth. This is a difficult task for the circuit designer, but more importantly the task must be repeated for each potential change or performance degradation results to compensate for a worse possible latency.

In the past, data memory devices relied on a feedback clock from which to generate a data read signal indicative of data availability—an end to the data latency period. These feedback clocks compensate for some aspects of the data read latency time relating to data propagation once retrieved. In order to accurately use the feedback clocks, a circuit latency from a data read instruction to data retrieval is calculated and then, a number of clock cycles representative of that length of time or longer is used to provide the remainder of the latency. This overcomes some packaging concerns with changed performance based on changed packaging.

Unfortunately, when designing memory macros for use in ASIC design, it would be advantageous if the macros operated for ASIC manufactured differently and used in varied applications. Prior art circuits either provide reduced performance in order to accommodate a worst case, or they operate only in very limited circumstances.

It would be advantageous to provide a method of determining data read latencies that is closely synchronized with the data read latencies and is somewhat independent of the manufacturing process employed or the environmental conditions of operation.

SUMMARY OF THE INVENTION

In accordance with the invention, there is provided a method of indicating data availability comprising the steps of: commencing a data read operation for retrieving data signals based on data stored within a memory storage the data signals having a first propagation delay; providing a strobe signal having a propagation delay similar to the first data propagation delay from the memory device to an external circuit and returning to the memory device; and based on the returned strobe signal indicating data availability, wherein the returned signal, in response to manufacturing and environmental changes, is affected similarly to the retrieved data signals.

In accordance with another aspect of the present invention, there is provided a memory integrated circuit comprising:

a memory storage;

a plurality of data ports;

a circuit for providing data signals of data read from within the memory storage to the plurality of data ports;

a first strobe port;

a circuit for providing a strobe signal to a circuit external the memory integrated circuit via the first strobe port, the strobe signal having similar delays to the provided data signals;

a second strobe port;

a circuit for receiving a returned strobe signal from a circuit external the memory integrated circuit via the second strobe port, the returned signal having a predetermined temporal relation to data availability of data retrieved from the memory storage, wherein in use the returned signal, in response to manufacturing and environmental changes, is affected similarly to the data signals.

BRIEF DESCRIPTION OF THE DRAWINGS

The invention will now be described with reference to the attached drawings in which.

DETAILED DESCRIPTION OF THE INVENTION

Figure 1:
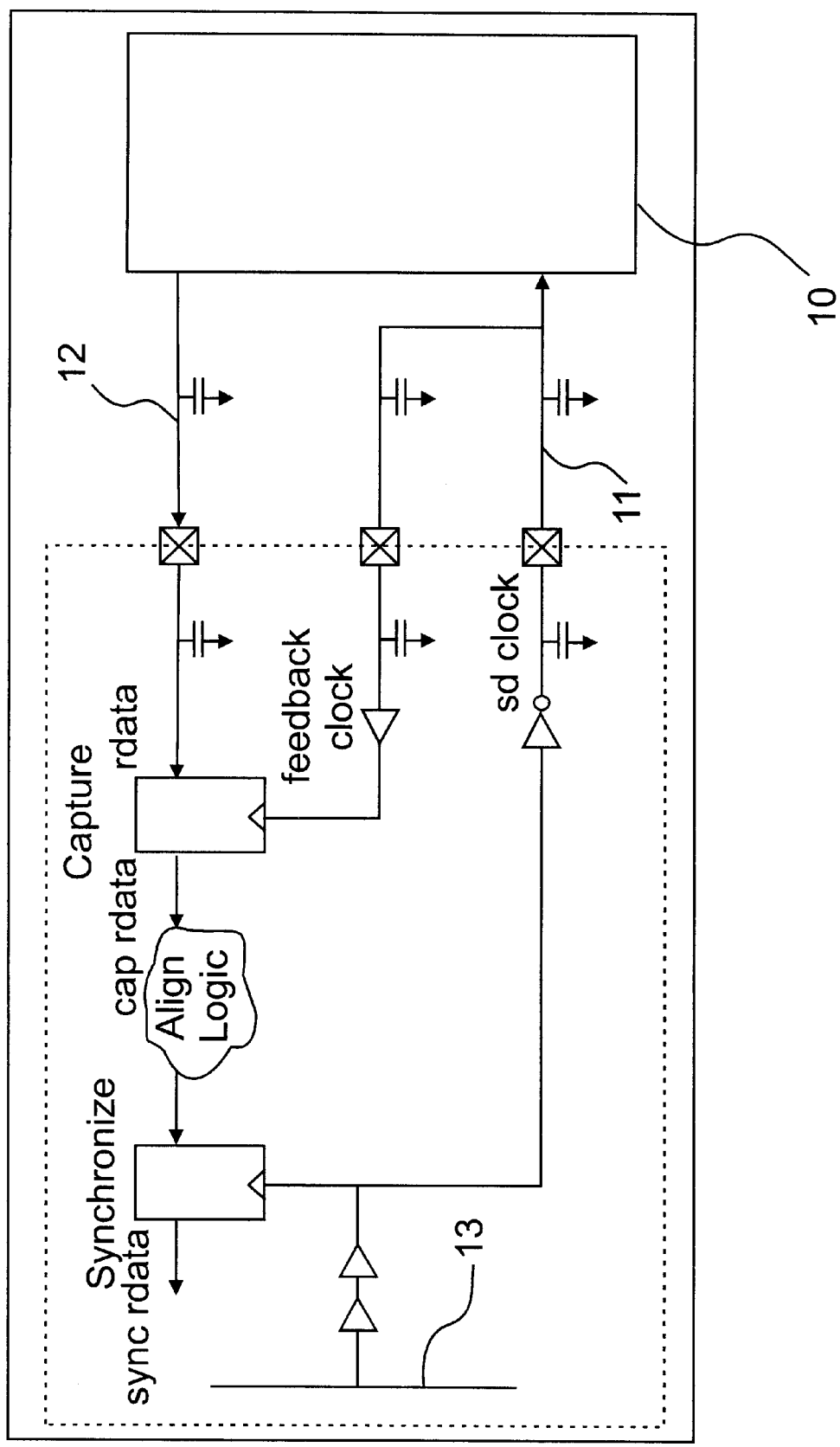
FIG. 1 is a prior art data read circuit.

Referring to FIG. 1, a prior art data read circuit is shown. The circuit includes an SDRAM device 10 having a plurality of input ports and a plurality of output ports. Of note in the diagram of FIG. 1 is a clock input port 11 for receiving the SDRAM clock and a plurality of SDRAM data output ports 12. Of course, instruction input ports are also typically present for providing CAS and RAS signals when used. Also, address input ports are present for providing address data indicative of the data address being read when a SDRAM device supports more than a single read address.

The provided clock signal sd_clock, provided as the SDRAM clock, is also used to provide a feedback clock to an external data read gating circuit. For example, the circuit may include latches for latching the data for use by the external circuit. If a known number of data cycles are required to get the data from memory storage to the SDRAM data output ports, then the feedback clock compensates for further delays inherent in signal propagation within the Integrated circuit or to the external circuit. Alternatively, the feedback clock is delayed by a circuit designer in accordance with a maximum possible latency to ensure that the data is correctly set-up prior to being latched. Typical feedback clock signals 13 originate off-chip—outside of the SDRAM—and therefore require a single pad of the SDRAM integrated circuit in order to operate. Because the feedback clock originates off-chip, it is subject to operating delays similar to those of other data lines and thereby provides feedback relating to some data propagation delays. As is evident to those of skill in the art, a change in manufacturing process will result in changes in read data latency including latency related to read operations other than data propagation and thus, if the clock rate remains unchanged, may require a different number of clock cycles as a delay to data availability. This is illustrated in the timing diagram of FIG. 2.

Figure 2:
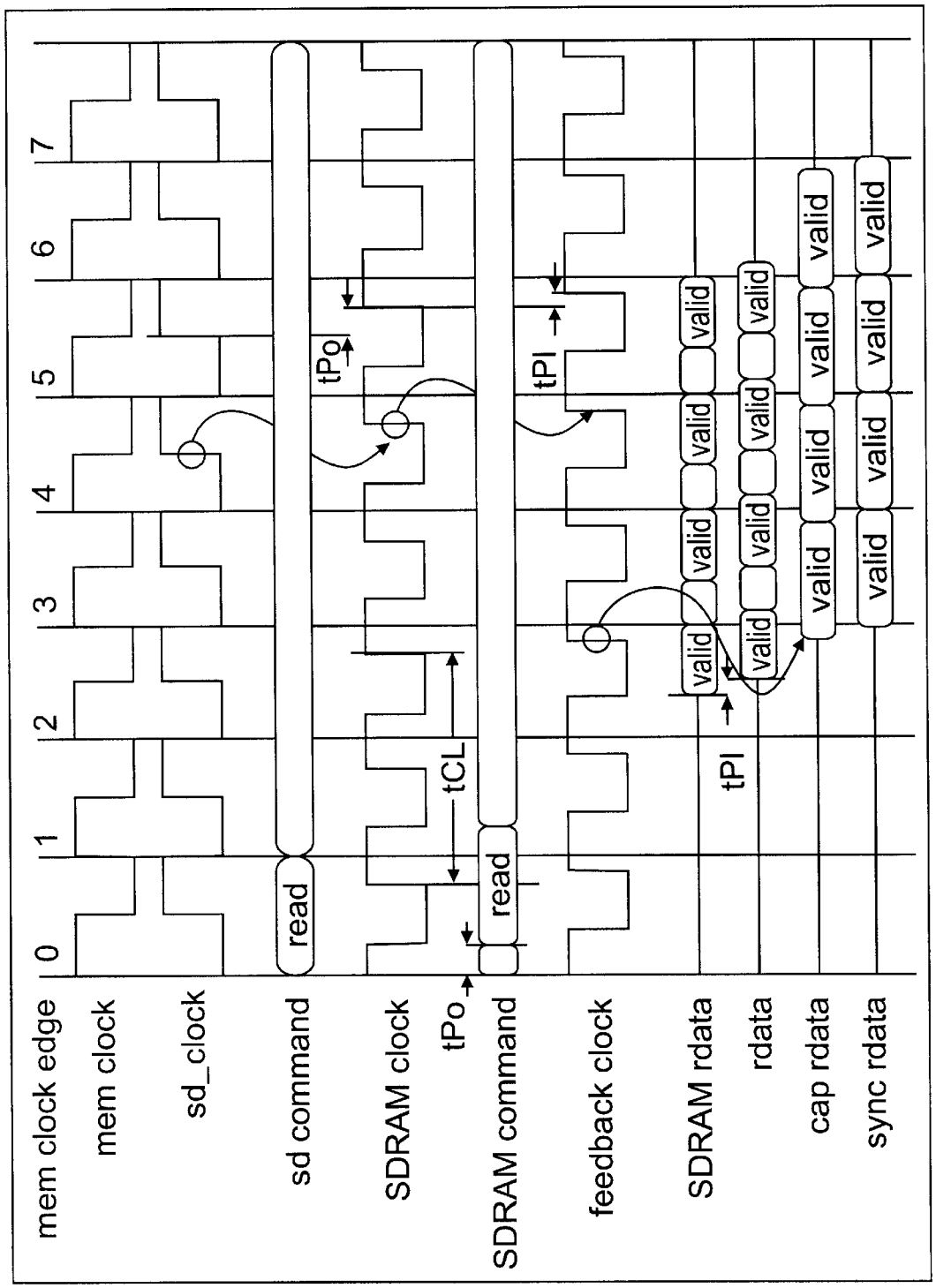
FIG. 2 is a timing diagram for the prior art data read circuit having a small propagation delay.
Figure 3:
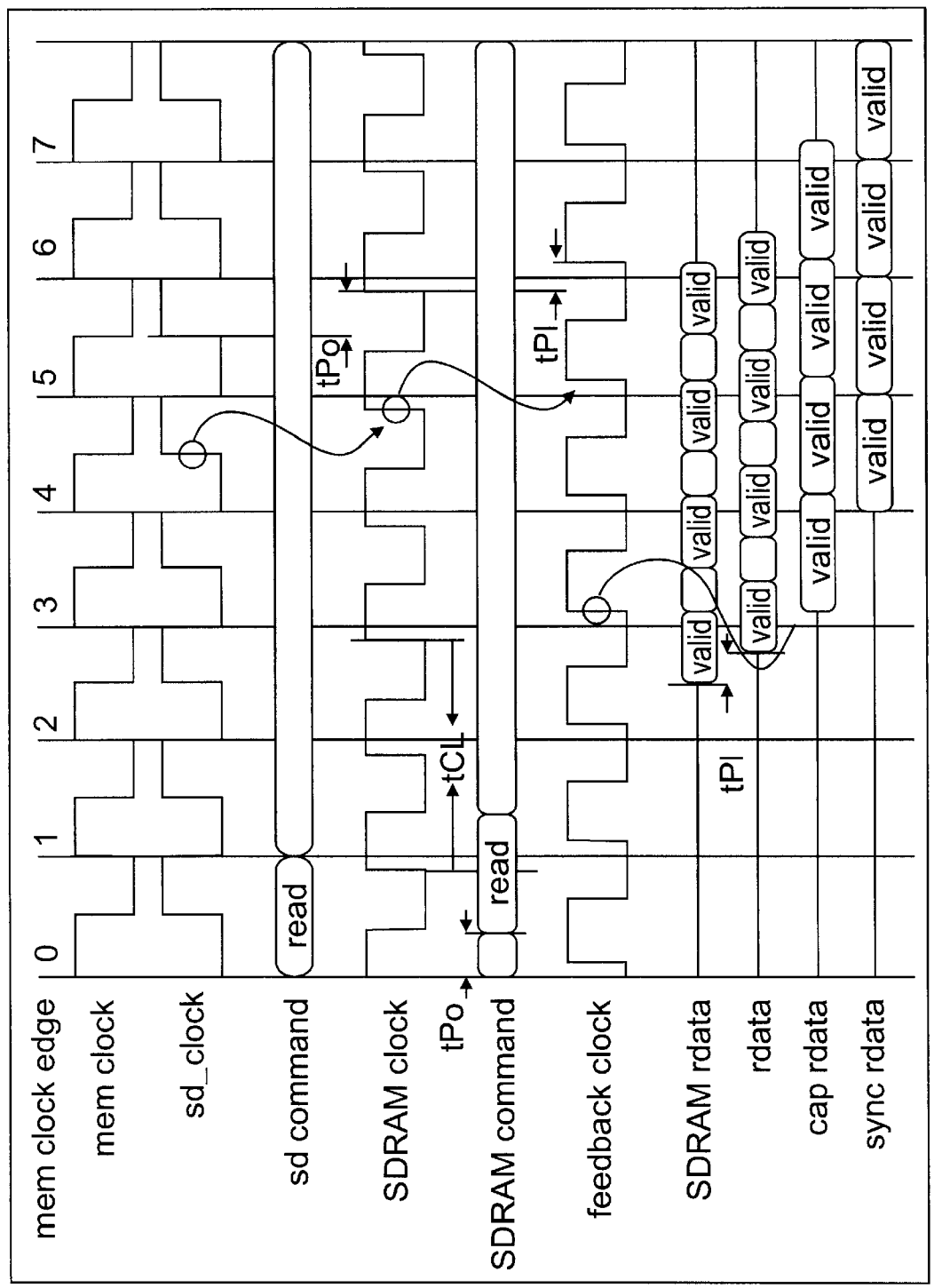
FIG. 3 is a timing diagram for the prior art data read circuit having a large propagation delay.

Referring to FIG. 2, a data read timing diagram in shown for the circuit of FIG. 1 manufactured using two different processes. Though the data input times and SDRAM clock rate remain identical in the two diagrams of FIG. 2 and FIG. 3, the data read is ready at different times. Clearly, the feedback clock reflects a small portion of this difference relating to some propagation delays. As is evident, the latch timing for the second manufacturing process is too soon to clock in the data. Alternatively, the integrated circuit is designed such that the latch occurs at a correct time for the data according to the second manufacturing process increasing the latency unnecessarily for the first manufacturing process.

Figure 4:
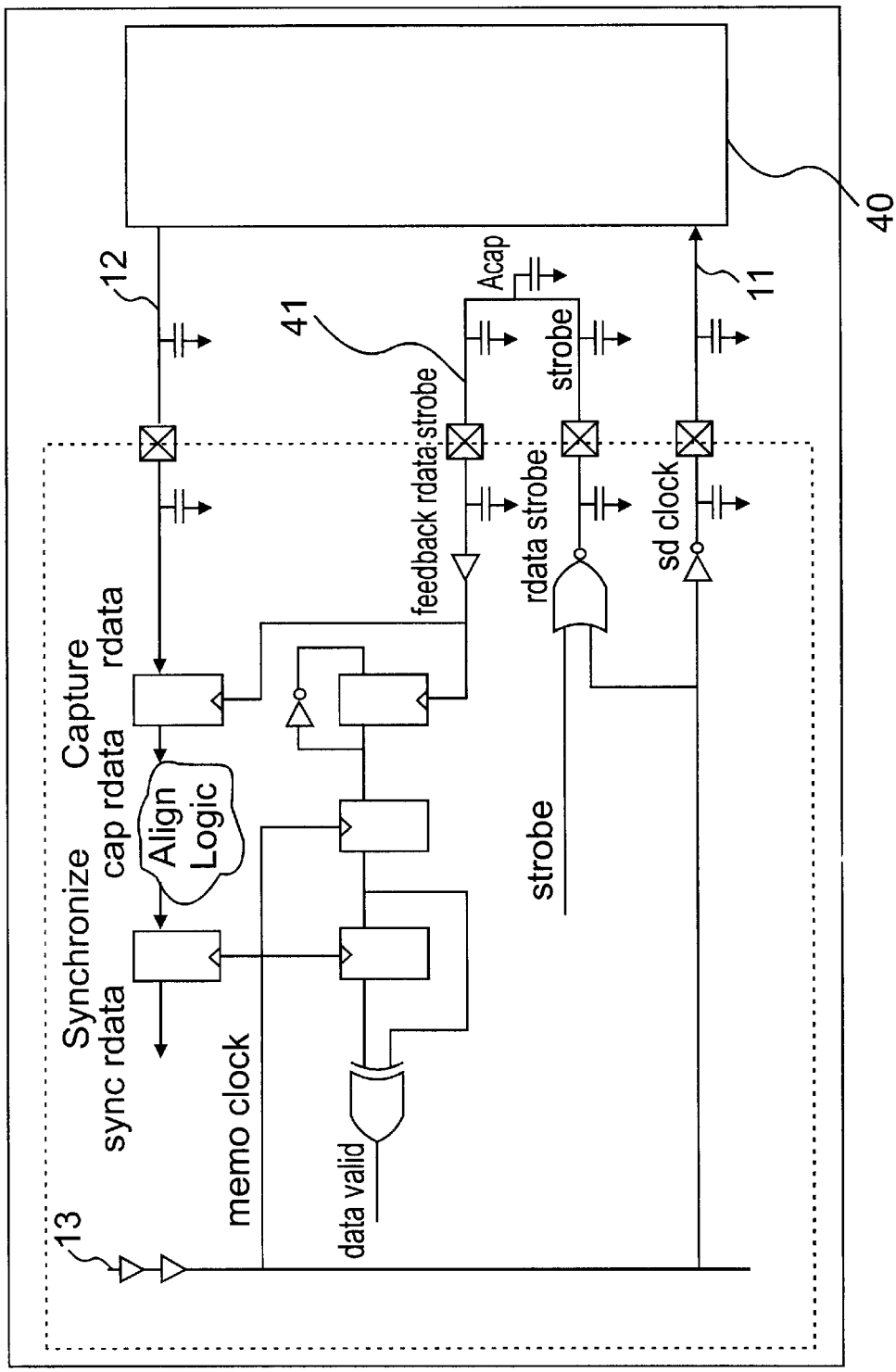
FIG. 4 is a data read circuit having a data strobe indicating data availability.

Referring to FIG. 4, an embodiment of a circuit according to the invention is shown. Here, a data strobe signal 41 is generated by the SDRAM device 40 and sent external to the device. Since the data read strobe relies on circuitry manufactured similarly to the remainder of the SDRAM device, the data strobe signal experiences similar variations in timing as the remainder of the circuit. Also, since the data read strobe operates within a same device as the SDRAM, it is subject to similar operating conditions. By designing the strobe signal generation circuit in accordance with common design principles, it is assured that even with temperature and manufacturing changes, the strobe signal will provide an indication of data availability within a predetermined window of time relative to the actual data availability.

Further, when manufacturing processes are changed, the strobe signal varies proportionally to the data availability thereby broadening the manufacturing processes and operating conditions supported by a same circuit with minimal additional latency in a data read operation. The cost of this flexibility and simplicity is an additional output port on the SDRAM device or from the SDRAM design block when integrated within an ASIC.

Figure 5:
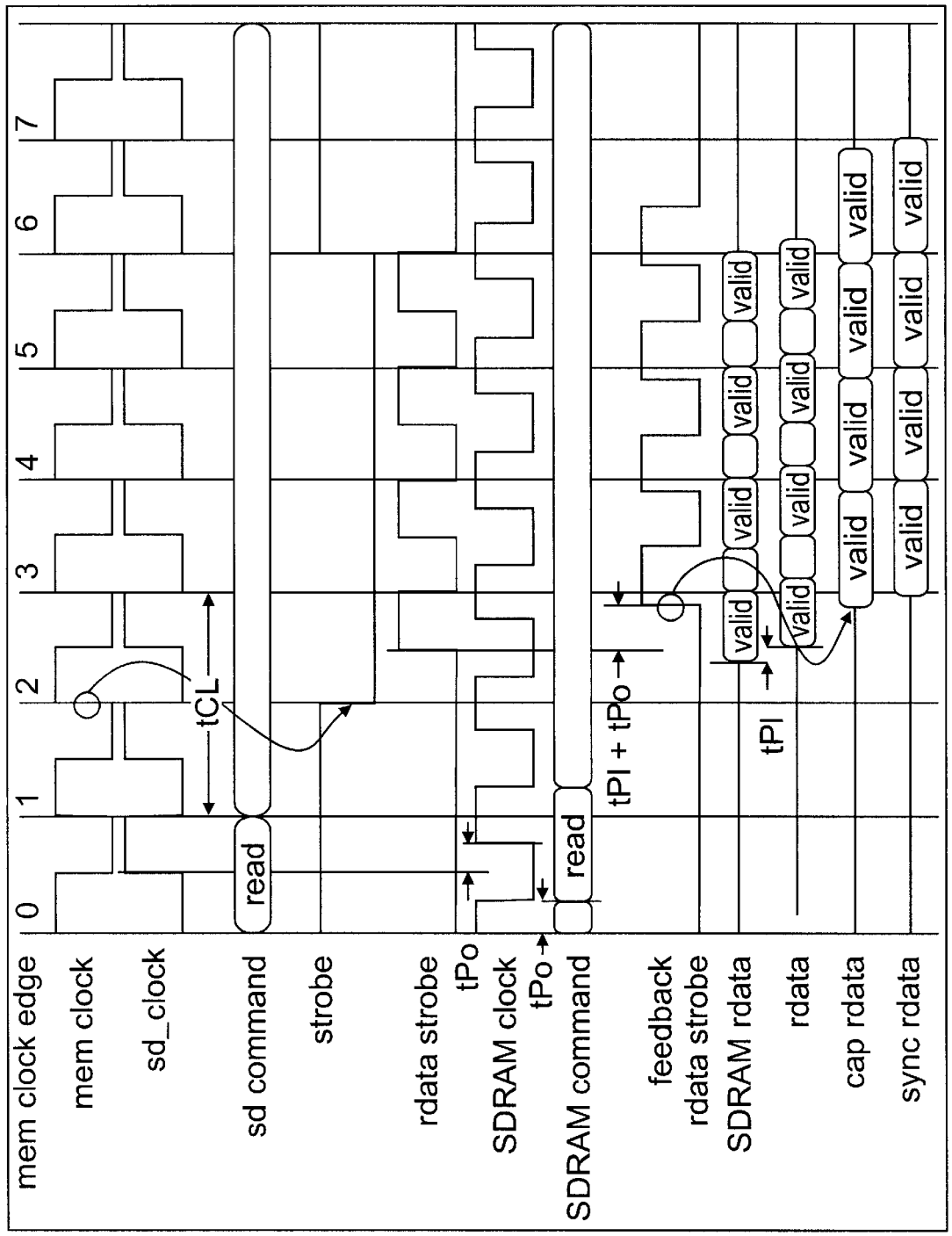
FIG. 5 is a timing diagram for the circuit of FIG. 4 having a short delay time for a latency; and, FIG. 6 is a timing diagram of the circuit of FIG. 4 having a long delay time for a latency.
Figure 6:
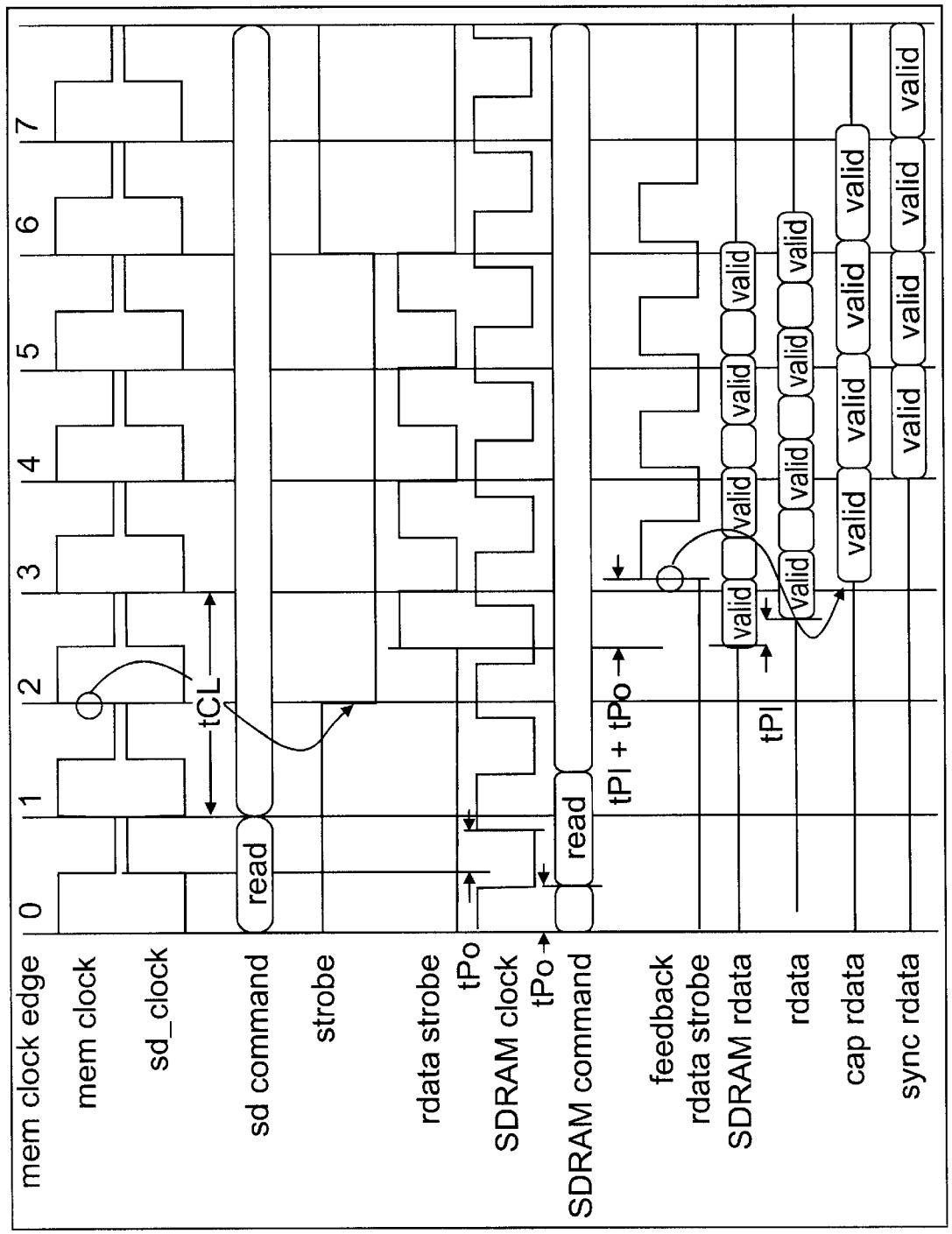

Referring to FIG. 5, a timing diagram for the circuit of FIG. 4 is shown with a long data read latency. FIG. 6 is a timing diagram of the circuit of FIG. 4 with a short data read latency. Of course, either are possible depending on manufacturing processes employed and other parameters. As is evident, though the latency for a data read operations are similar to the latencies illustrate in FIG. 2, no problems with data strobing result. Further, in the timing diagram of FIG. 5, performance is faster due to the latency, as is required for proper operation. In the diagram of FIG. 6, performance is slower as is permitted. As such, each part accommodates its own performance characteristics allowing for improved operating performance of one part relative to another when so desired.

Instead of using the return feedback clock to capture the data, the strobe is used. This signal must traverse a similar path as the off-chip clock in FIG. 1. The signal must go off-chip and then back on chip to incur the same propagation time as the feedback clock used previously. Once on-chip, it can then be used to capture the data and produce a "data-valid" signal to the SDRAM Controller. The SDRAM Controller then uses the read data with confidence since the active low strobe is de-asserted when read data is not expected. The SDRAM Controller asserts this signal in the timing cycle when the SDRAM part normally broadcasts its read data, which is controllable and typically 2–3 clock cycles prior to a read command. The SDRAM Controller no longer needs software controlled propagation delay information to know which on-chip SDRAM controller clock cycle the read data will become valid since the feedback strobe inherently provides this information.

The circuit according to the invention also supports integrated circuits operating at near optimal performance regardless of manufacturing tolerances. An SDRAM device having slower performance due to manufacturing related or operational issues operates correctly since the strobe signal arrives at approximately a correct time within the integrated circuit within its operating environment. As such, the resulting design is flexible requiring significantly less design limitations. Fewer limitations allows for laxer designs wherein exacting latency calculations are obviated.

Though the term external circuit is used to describe the latching circuit, the circuit and the SDRAM may form part of a same integrated circuit component such as a part of a different design block from the SDRAM circuit. Typically, the SDRAM is a single integrated circuit and the external circuit is external thereto.

Though the circuit of the present invention requires an additional output pad from the integrated circuit when a separate integrated SDRAM device is implemented, this is considered acceptable in exchange for the improved functionality.

Advantageously, unlike prior art circuits, since the strobe signal to indicate data read occurs within a predetermined window of time about data availability, data is latched only when it is potentially available. This reduces power consumption over prior art circuits wherein data is latched over many cycles—typically each cycle of the feedback clock.

Advantageously as frequency, or operating temperature, or process technology change, the feedback strobes propagation delay also changes. Since this signal generates the data valid signal to the SDRAM controller instead of the SDRAM controller predicting when the data is valid via software, data capture errors can be avoided resulting in robust system. This advancement requires a minimal amount of additional logic and an additional output pad.

Numerous other embodiments may be envisaged without departing from the spirit or scope of the invention.

What is claimed is:

1. A method of indicating data availability comprising the steps of:

commencing a data read operation for retrieving data signals based on data stored within a memory storage the data signals having a first propagation delay;

providing a strobe signal having a propagation delay similar to the first data propagation delay from the memory device to an external circuit and returning to the memory device; and indicating data availability based on the returned strobe signal, wherein the returned signal, in response to manufacturing and environmental changes, is affected similarly to the retrieved data signals.

2. A method according to claim 1, wherein the data is latched out of the memory circuit fewer than every clock cycle.

3. A method according to claim 2, wherein the memory is an SDRAM memory device.

4. A method according to claim 3, wherein the SDRAM comprises a first output pad for providing the strobe signal from the SDRAM device and a second output pad for receiving the returned strobe signal.

5. A memory integrated circuit comprising:

a memory storage;

a plurality of data ports;

a circuit for providing data signals of data read from within the memory storage to the plurality of data ports;

a first strobe port;

a circuit for providing a strobe signal to a circuit external the memory integrated circuit via the first strobe port, the strobe signal having similar delays to the provided data signals;

a second strobe port;

a circuit for receiving a returned strobe signal from the circuit external the memory integrated circuit via the second strobe port, the returned signal having a predetermined temporal relation to data availability of data retrieved from the memory storage, wherein in use the returned signal, in response to manufacturing and environmental changes, is affected similarly to the data signals.

* * * * *